United States Patent [19]
Lien

[11] Patent Number: 5,820,926
[45] Date of Patent: Oct. 13, 1998

[54] PROCESS FOR FORMING AND USING A NON-REACTIVE ANTI-REFLECTION COATING

[75] Inventor: Chuen-Der Lien, Mountain View, Calif.

[73] Assignee: Integrated Device Technology, Inc., Santa Clara, Calif.

[21] Appl. No.: 479,881

[22] Filed: Jun. 7, 1995

Related U.S. Application Data

[62] Division of Ser. No. 78,929, Jun. 16, 1993.
[51] Int. Cl.[6] ..................................................... G03C 1/00
[52] U.S. Cl. .................. 427/162; 430/271.1; 430/275.1; 430/278.1; 430/314; 430/317; 430/318
[58] Field of Search .......................... 427/162; 430/271.1, 430/275.1, 278.1, 314, 317, 318

[56] References Cited

U.S. PATENT DOCUMENTS

| | | | |
|---|---|---|---|
| 4,668,335 | 5/1987 | Mockler | 430/318 |
| 4,782,380 | 11/1988 | Shankar | 357/71 |
| 4,820,611 | 4/1989 | Arnold | 430/275.1 |
| 4,857,418 | 8/1989 | Schuetz | 428/693 |
| 5,120,679 | 6/1992 | Boardman | 437/195 |
| 5,135,877 | 8/1992 | Albergo | 437/23 |
| 5,219,788 | 6/1993 | Abernathey | 430/318 |
| 5,290,734 | 3/1994 | Boardman | 437/195 |

*Primary Examiner*—Timothy M. Speer
*Attorney, Agent, or Firm*—Skjerven, Morrill, MacPherson, Franklin & Friel

[57] ABSTRACT

An anti-reflection coating is provided that has a barrier layer and an anti-reflective layer. The barrier layer stops reactions between the anti-reflective layer and underlying layers or substrates, does not make the anti-reflective layer reflective, and preferably does not react with either the reflective layer or the anti-reflective layer. In particular embodiments, the barrier layer is a thin layer of silicon dioxide $SiO_2$ or silicon nitride $Si_3N_4$, and the anti-reflective layer is titanium-tungsten TiW, titanium nitride TiN, or amorphous silicon.

21 Claims, 1 Drawing Sheet

PROCESS FOR FORMING AND USING A NON-REACTIVE ANTI-REFLECTION COATING

This application is a division of application Ser. No. 08/078,929, filed Jun. 16, 1993, pending.

BACKGROUND OF THE INVENTION

1. Field of the Invention

This invention relates generally to the field of integrated circuit manufacture, and more particularly to the prevention of reactions between anti-reflection coatings and underlying layers.

2. Description of Related Art

Masks used during integrated circuit (IC) fabrication are often formed by irradiating a layer of photoresist with light. The light irradiates a precise pattern on the photoresist and makes the irradiated photoresist either harder to remove or easier to remove, depending on the type of photoresist used. After irradiation, unwanted areas of photoresist are removed in a developing step that leaves behind the desired mask.

Such masks are formed over many types of materials including reflective materials such as aluminum or polycrystalline silicon. Unfortunately, the reflective materials often reflect light into regions of photoresist that are not intended to be irradiated. The unintentional irradiation causes the resulting mask to be inaccurate, by causing, for example, notches in the mask or inaccurate line widths.

To prevent unwanted reflection, an anti-reflection coating (ARC) is applied on reflective materials prior to the application of photoresist. For example, a thin layer of titanium-tungsten TiW, titanium nitride TiN, or amorphous silicon may be formed on aluminum to reduce reflection from the surface of the aluminum. Although, the ARC reduces reflections and permits accurate patterning of masks, prior art ARCs react with the underlying layers causing several problems.

One problem occurs when titanium-tungsten, which is commonly employed as an ARC, reacts with aluminum upon heating to form a residue which penetrates grain boundaries in the aluminum. The residue, being in the grain boundaries, is very difficult to remove. The residue reduces the bonding strength between the aluminum layer and other layers, or between the aluminum layer and gold bonding wires. Over time, the residue can cause failure of the bond. Titanium nitride is thought to create the same type of residue and bonding problems as titanium-tungsten.

Another problem with ARC chemical reactions occurs when amorphous silicon is used. Amorphous silicon, possibly in combination with developing chemicals used to remove unwanted photoresist, reacts with underlying aluminum and leaves areas of residue on the aluminum. The areas of residue act as a mask and prevent etching of the aluminum beneath the residue. Accordingly, areas of aluminum may be left where the aluminum should have been etched away.

Still another problem caused by the reactions of aluminum with ARCs is related to junction spiking which refers to undesirable diffusion of aluminum into an adjacent layer of silicon at an aluminum-silicon junction. Junction spiking has the effect of changing the dopant concentration of the silicon. To prevent junction spiking, silicon is often mixed into aluminum to saturate the aluminum. The saturated aluminum draws less silicon from an underlying substrate and releases less aluminum into the substrate. Barrier layers are also employed to stop diffusion.

ARCs can exacerbate the junction spiking problem. If the ARC reacts with and draws silicon from the aluminum, the aluminum has greater tendency to draw silicon from the substrate. Accordingly, with an ARC in contact with aluminum, thicker barrier layers must be employed between the aluminum and the substrate, resulting in increased materials cost and additional time to manufacture the device.

One prior art method to minimize the problems mentioned above is to remove the ARC before any major thermal cycle. Because most residues are formed during heating, early removal of ARC from critical areas prevents most of the problems. However, removal of the ARC before thermal cycles is out of the normal sequence of processing and therefore often requires additional masking and etching steps.

Therefore, an ARC is needed that does not react with underlying layers.

SUMMARY OF THE INVENTION

According to one embodiment of the present invention an anti-reflection coating is provided which is comprised of a barrier layer and an anti-reflective layer. The barrier layer is comprised of a material which prevents reactions between the anti-reflective layer and underlying layers or substrates, does not make the anti-reflective layer reflective, and preferably does not react with either the reflective layer or the anti-reflective layer. In particular embodiments of the invention, the barrier layer is a thin layer of silicon dioxide $SiO_2$ or silicon nitride $Si_3N_4$, and the anti-reflective layer is titanium-tungsten TiW, titanium nitride TiN, or amorphous silicon.

Another embodiment of the present invention provides an improved method of manufacturing anti-reflection coatings which comprises forming a chemically protective layer on a wafer having reflective layers formed thereon, then forming an anti-reflective layer on the barrier layer to prevent undesired reflections during masking of photo resist.

DETAILED DESCRIPTION OF THE PREFERRED EMBODIMENTS

Figure 1:
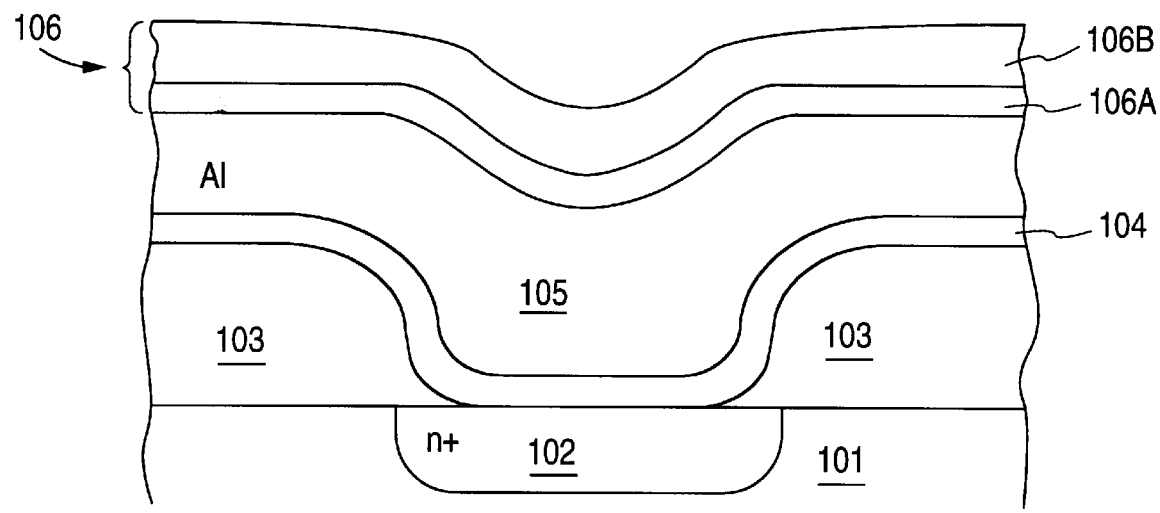
FIG. 1 is cross-sectional view of a portion of an integrated circuit having an anti-reflection coating according to the invention.

In order to prevent reactions between an ARC and an underlying reflective layer, the ARC is provided with a barrier layer and an anti-reflective layer, with the barrier layer between the anti-reflective layer and the reflective layer. FIG. 1 shows a cross-sectional view of a portion of an integrated circuit which includes an anti-reflection coating 106 in accordance with the present invention.

In FIG. 1, the integrated circuit shown includes a substrate 101 having an N-type region 102. Overlying substrate 101 is a field oxide layer 103, a barrier layer 104, and a reflective layer 105, which may be, for example, comprised of aluminum. Barrier layer 104 is for stopping junction spiking and is typically formed using a material such as titanium-tungsten TiW or titanium nitride TiN about 2000 Å thick. Reflective layer 105 conducts and makes electrical contact with N-type region 102 through barrier layer 104. Commonly used conductive layers which are reflective include aluminum, aluminum/silicon, and doped polycrystalline silicon. Methods for forming conducting layers such as layer 105 are well known in the art. The thickness of layer 105 depends on the purpose of layer 105.

Anti-reflection coating 106 is formed on layer 105 and comprises a barrier layer 106A and an anti-reflective layer 106B. Barrier layer 106A is silicon dioxide having a thickness of from about 100 Å to about 150 Å. Silicon dioxide is used because the interactions (or lack of interaction) of silicon dioxide are well known from years of use in the art. However, barrier layer 106A may be made of other materials. A suitable material for barrier layer 106A must prevent reaction between layer 105 and anti-reflective layer 106B, should not react with anti-reflective layer 106B, and must not cause anti-reflective layer 106B to become reflective. Other suitable materials include silicon nitride and aluminum oxide.

Anti-reflective layer 106B may be formed of any material that reduces reflected light. Suitable materials include titanium-tungsten, tungsten nitride, and amorphous silicon. A typical anti-reflective layer would be 600 Å thick and made of titanium-tungsten TiW. Methods for forming layers like 106B are well known in the art and include such techniques as CVD and sputterring.

FIG. 1 also illustrates how the invention helps to prevent junction spiking. When layer 105 is aluminum saturated with silicon, barrier layer 106A prevents a chemical reaction involving anti-reflective layer 106B and layer 105 which would draw silicon from layer 105. Since aluminum layer 105 remains saturated with silicon, barrier layer 104 can be made thinner and still stop junction spiking.

Figure 2:
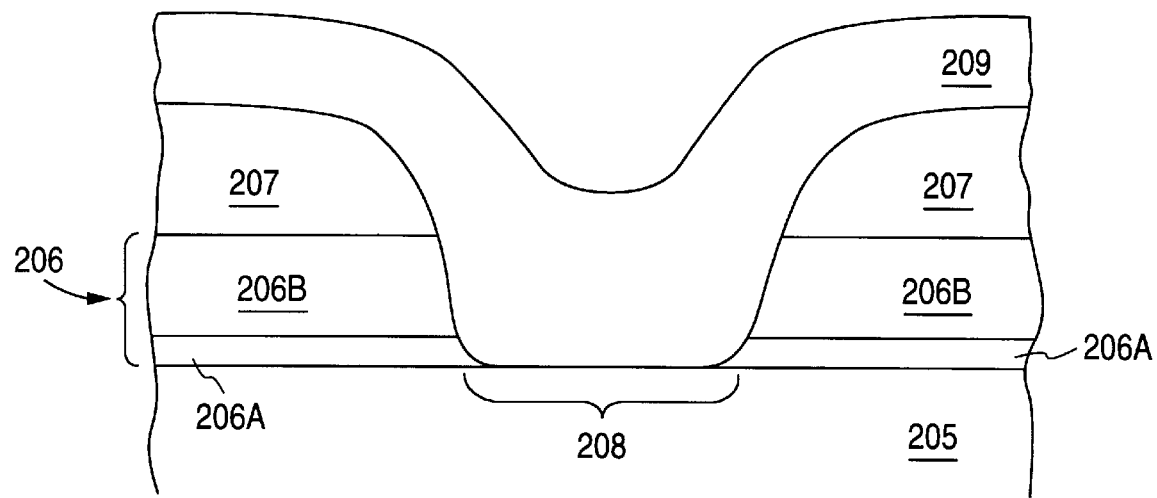
FIG. 2 is a cross-sectional view of an integrated circuit showing a metal via in accordance with the invention.

FIG. 2 shows a cross-section of a via connecting two conducting layers 205 and 209. Conducting layer 205 would typically be aluminum/silicon which has anti-reflection coating 206 formed on a surface. Anti-reflection coating 206 comprises barrier layer 206A (typically made of silicon dioxide) and an anti-reflective layer 206B, (typically made of titanium-tungsten). Layers 206A and 206B have dimensions and composition similar to layers 106A and 106B described above. Formed on anti-reflection coating 206 is an insulating layer 207 which typically comprises silicon dioxide deposited using well known techniques. A via 208 is etched through insulating layer 207 and anti-reflection coating 206 using well known mask and etch techniques.

Anti-reflection coating 206 prevents unwanted reflections during the masking process, and because of barrier layer 206A, anti-reflection coating 206 need not be removed before thermal processes such formation of the insulating layer 207. A single mask and etching step removes both anti-reflection coating 206 and insulating layer 207 from the desired areas. Still, no ARC-aluminum reaction occurs and no residue forms in grain boundaries of layer 205. Accordingly, etching of via 208 provides a clean surface on layer 205 for conducting layer 209 to bond.

If prior art techniques were utilized and the prior art ARC layer were not removed before thermal processes, there would be residue in the grain boundaries of layer 205 which would not be removed by etching. A weaker bond would be formed between layers 205 and 209. Alternatively in the prior art, the ARC layer could be removed from the via before any thermal processes, but that requires that the via region be masked and etched twice, once before formation of insulating layer 207 and once after. Accordingly, the present invention provides a strong bond without need of extra masking and etching steps.

Although, FIG. 2 shows bonding of layers 205 and 209, the weakening caused by residue formed using prior art ARCs is more critical for bonds between gold bonding wires and aluminum bonding pads. Using a via in accordance with the present invention as described above creates a cleaner bonding surface and a stronger and longer lasting gold to aluminum bond.

Although the present invention has been described in detail, the description is only an illustration of the invention's application and should not be taken as a limitation. The scope of the invention is defined by the following claims.

I claim:

1. A method for forming an anti-reflection coating, comprising the steps of:

providing a substrate having a reflective layer thereon;

forming a barrier layer on the reflective layer, wherein the barrier layer is formed from a material which does not chemically react with the reflective layer; and forming an anti-reflective layer directly on the barrier layer so that the barrier layer is between the anti-reflective layer and the reflective layer.

2. A method for masking a reflective layer, comprising the steps of:

forming an anti-reflection coating on the reflective layer, wherein forming the anti-reflection coating comprises the steps of:

forming a barrier layer on the reflective layer from a material which does not chemically react with the reflective layer; and forming an anti-reflective layer on the barrier layer, wherein the barrier layer prevents the anti-reflective layer from chemically reacting with the reflective layer;

forming a photoresist layer on the anti-reflective layer; and exposing a selected portion of the photoresist layer to light which changes properties of the selected portion of the photoresist layer, wherein the anti-reflective layer prevents reflection of the light from the reflective layer.

3. The method of claim 2, wherein the step of forming the barrier layer comprises forming a silicon dioxide layer.

4. The method of claim 2, wherein the step of forming the anti-reflective layer comprises forming a titanium-tungsten layer.

5. The method of claim 2, wherein the step of forming the barrier layer comprises forming a silicon dioxide layer that is between about 100 angstroms and about 150 angstroms thick.

6. The method of claim 5, wherein the step of forming the anti-reflective layer comprises forming a titanium-tungsten layer.

7. The method of claim 5, wherein the step of forming the anti-reflective layer comprises forming a titanium-tungsten layer that is between about 400 angstroms and about 800 angstroms thick.

8. The method of claim 2, wherein the step of forming the barrier layer comprises forming a silicon nitride layer.

9. The method of claim 2, wherein the step of forming the anti-reflective layer comprises forming a titanium nitride layer.

10. The method of claim 2, wherein the step of forming the anti-reflective layer comprises forming an amorphous silicon layer.

11. The method of claim 2, further comprising:

patterning the reflective layer and anti-reflection coating according to a pattern formed by the selected portions of the photoresist layer;

depositing an insulating layer on the anti-reflection coating; and masking the insulating layer, wherein the anti-reflective layer prevents reflection of light from the reflective layer during masking of the insulating layer.

12. The method of claim 2, wherein the reflective layer contains aluminum.

13. The method of claim 12, further comprising:

forming a bonding pad from a portion of the reflective layer;

depositing an insulating layer on the anti-reflection coating; and masking the insulating layer, wherein the anti-reflective layer prevents reflection of the light from the reflective layer during masking of the insulating layer.

14. The method of claim 13, further comprising:

etching a via through the insulating layer and the anti-reflection coating to expose the bonding pad; and bonding a gold wire to the bonding pad exposed by the via.

15. A method comprising:

forming an anti-reflection coating on a reflective layer, wherein forming the anti-reflection coating comprises:
  forming a barrier layer from a material which does not chemically react with the reflective layer; and
  forming an anti-reflective layer on the barrier layer, wherein the barrier layer prevents the anti-reflective layer from chemically reacting with the reflective layer;

forming a bonding pad from a portion of the reflective layer, wherein a portion of the anti-reflection coating is on the bonding pad;

depositing an insulating layer on the anti-reflection coating;

forming a photoresist layer on the insulating layer; and exposing a selected portion of the photoresist layer to light which changes properties of the selected portion of the photoresist layer, wherein the anti-reflective layer prevents reflection of the light from the reflective layer.

16. The method of claim 15, further comprising:

etching a via through the insulating layer and the anti-reflection coating to expose the bonding pad; and bonding a gold wire to the bonding pad exposed by the via.

17. The method of claim 16, wherein the reflective layer comprises aluminum.

18. The method of claim 17, wherein the barrier layer comprises a material selected from the group consisting of silicon dioxide, aluminum oxide, and silicon nitride.

19. The method of claim 18, wherein the anti-reflective layer comprises a material selected from the group consisting of titanium-tungsten, titanium nitride, and amorphous silicon.

20. The method of claim 17, further comprising:

etching a via through the insulating layer and the anti-reflection coating to expose the bonding pad; and bonding a gold wire to the bonding pad exposed by the via.

21. The method of claim 17, wherein the anti-reflective layer comprises a material selected from the group consisting of titanium-tungsten, titanium nitride, and amorphous silicon.

* * * * *